United States Patent [19]

Matsuoka

[11] Patent Number: 4,599,608
[45] Date of Patent: Jul. 8, 1986

[54] CIRCUIT PREVENTING PHANTOM INPUT IN A SWITCH MATRIX

[75] Inventor: Shigeru Matsuoka, Hitachi, Japan
[73] Assignee: Hitachi, Ltd., Tokyo, Japan
[21] Appl. No.: 477,373
[22] Filed: Mar. 21, 1983
[30] Foreign Application Priority Data
Mar. 19, 1982 [JP] Japan .................................. 57-42679
[51] Int. Cl.⁴ ............................................. G08C 25/00
[52] U.S. Cl. ............................ 340/365 S; 340/365 E
[58] Field of Search ............ 340/365 R, 365 S, 365 E; 84/1.01, 1.11–1.19; 178/17 C

[56] References Cited

U.S. PATENT DOCUMENTS

| | | | |
|---|---|---|---|
| 4,106,011 | 8/1978 | Melanson | 340/365 S |
| 4,136,336 | 1/1979 | Abe | 340/365 S |
| 4,231,016 | 10/1980 | Ueda | 340/365 E |
| 4,283,714 | 8/1981 | Trenkler | 340/365 S |
| 4,420,744 | 12/1983 | Jesson | 340/365 E |

Primary Examiner—John W. Caldwell, Sr.
Assistant Examiner—Michael F. Heim
Attorney, Agent, or Firm—Antonelli, Terry & Wands

[57] ABSTRACT

In an information processing apparatus with an input device in the form of a keyboard, a multiplicity of switches associated with input keys on the keyboard are disposed in independent submatrices. When three or more keys in each submatrix are operated simultaneously, key input detection is stopped. The number of switches which are turned on in each scanning is registered and when the number is two at the most, addresses representative of the switches which are turned on are delivered out for inputting information. Key input at high speeds can be permitted and erroneous input can be prevented.

14 Claims, 11 Drawing Figures

CIRCUIT PREVENTING PHANTOM INPUT IN A SWITCH MATRIX

This invention relates to input systems using a switch matrix and more particularly an input system wherein on-off states of a plurality of switches are detected by scanning operation.

Most of information processing apparatus such as a computer or a word processor use an input device having a plurality of switches such as a keyboard of a typewriter. The term "switch" means hereinafter a bidirectional switch of a simple type in which two contacts make and break. Typically, a matrix circuit is used for detecting on-off states of a multiplicity of switches. More particularly, each of the switches is disposed at a cross point of row and column of a matrix, and connection or disconnection between each row and each column is detected by scanning to detect on-off state of respective switches.

With the bidirectional switches, however, it happens that a switch to be recognizad as being off is detected as being on when three or more switches are turned on simultaneously. To prevent such an error in detection, in a conventional expedient, the respective switches are rendered unidirectional by, for example, connecting a diode in series with each switch. The connection of the diode to each of the multiplicity of switches, however, increases the number of parts, the manufacture process and cost, the percentage of failure occurrence and the occupation space. Therefore, the advent of an input system has long been desired which can prevent erroneous input without resort to the connection of the diode to each switch.

An object of the present invention is to provide an input system using a switch matrix which can prevent erroneous input without connecting a diode to each switch of the switch matrix.

According to an aspect of the present invention, a plurality of bidirectional switches are divided into a plurality of mutually independent groups, and input operation is stopped when on-states of three or more switches within each group are detected simultaneously.

When the switch matrix is divided into two mutually independent submatrices, for example, simultaneous operation of four switches at the most can exactly be detected simultaneously throughout the entire matrix. The order of on-state switch simultaneously operated can be detected by the order of scanning in which the on-state of the switch is initially detected. When three or more switches within one submatrix are operated simultaneously, input operation is stopped to thereby prevent erroneous input. Here, mutual independency of the submatrices $(x_{ij})$ and $(x_{kl})$ means that $i \neq k$ and $j \neq l$.

Stoppage of the input operation may be released when the number of operated switches within one submatrix becomes zero or when the number becomes two or less.

Typically, the key input system is required to satisfy the following requirements:

(1) A high speed of key input of about 300 strokes/minute in average (200 msec/key in average) can be assured; and (2) At least two keys, for example a character key and a shift key, can be operated simultaneously for their use in combination.

Under the circumstances, simultaneous occurrence of on-states of three keys obviously tends to take place throughout the entire keyboard.

Accordingly, keys required to be operated simultaneously may be classified into different independent groups. For example, auxiliary function keys, such as a shift key for capital letter designation and a continuation key for continuous input designation of the same key, and main function keys for alphabetical and numerical character designation may be arranged in different groups.

The keys may also be classified from different standpoints of view. For example, right-hand-finger-operated keys and left-hand-finger-operated keys may be classified into different groups. Various types of classification may also be combined.

The other objects, features and advantages of the present invention will become apparent from the following description taken in conjunction with the accompanying drawings, in which:

Figure 1:
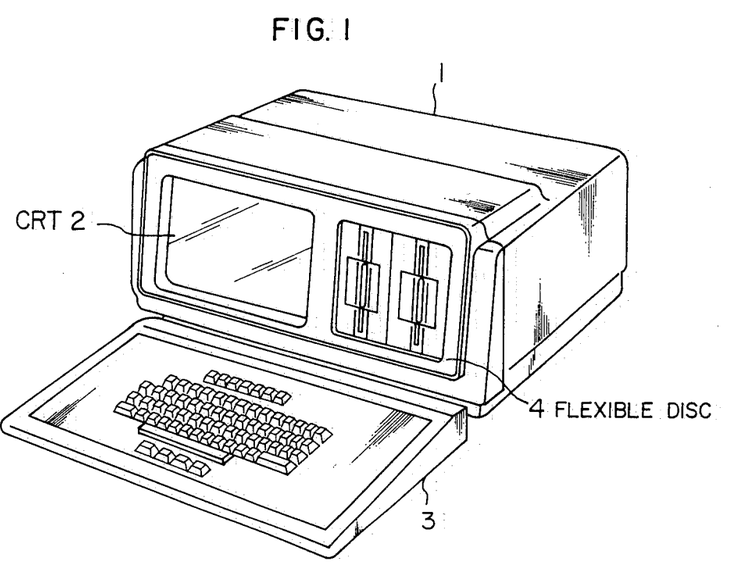
FIG. 1 is a perspective view of an information processing apparatus provided with a keyboard.

FIG. 1 shows an external appearance of a typical information processing apparatus. A main body 1 housas a cathode ray tube (CRT) 2 for state display, and a peripheral memory with 4 in the form of a flexible disc unit for driving flexible memory media (floppy discs). Located in front of the main body 1 is an input device 3 in the form of a keyboard which is operated by an operator to input alphabetical and numerical characters. The following description will be given by way of a word processor.

Figure 2:
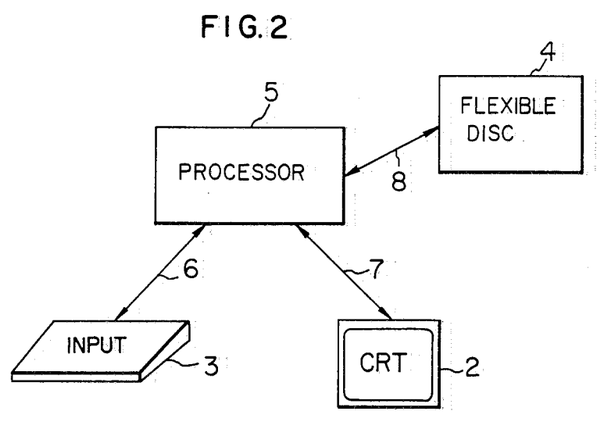
FIG. 2 is a block diagram of the information processing apparatus.

As schematically shown in FIG. 2, a processor 5 is connected to peripheral units such as the CRT display 2, input device 3 and peripheral memory unit 4 through cables 6, 7 and 8.

Figure 3:
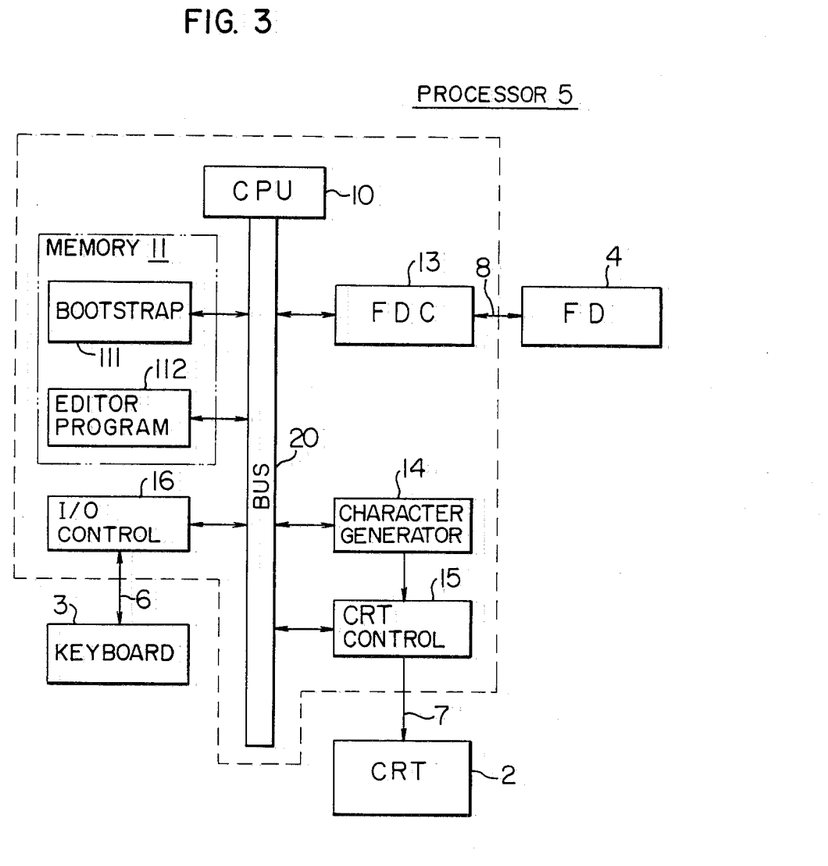
FIG. 3 is a block diagram showing connection of principal components of a processor in FIG. 2 to peripheral components.

The processor 5 of FIG. 2 will be explained by referring to FIG. 3. As diagrammatically shown in FIG. 3, the processor 5 comprises a program storage type computing unit 10 (hereinafter referred to as CPU), a memory 11 including a bootstrap ROM 111 which is a non-volatile memory having a program executed upon closure of a power supply, and a program memory 112 for storing a program for execution of a function of editor, a character generator 14 for storing, by retrieving alphabetical and numerical codes, dot data to represent alphabetical and numerical characters, for example, in the form of a dot matrix, a CRT controller 15 which reads the dot data from the character generator 14 in accordance with an instruction from the CPU 10 and generates a signal for operating the CRT 2, a flexible disc controller 13 for controlling the flexible disc unit of a temporary memory, and a bus line 20 for interconnection between the components.

With the above construction, when the power supply is switched on, the CPU executes a bootstrap program stored in an initial program loader, i.e., the bootstrap ROM 111. By the bootstrap program, a data stored in a flexible disc (not shown) set in the flexible disc unit 4 is transferred to the program memory 112. After completion of the transfer, the CPU 10 causes control operation to branch to a heading address of an editor program stored in the program memory 112.

Thereafter, data inputted by the keyboard 3 is processed by an I/O controller 16 and the CPU 10 so as to display a character on the CRT 2 or so as to be edited. The I/O controller 16 may include only an I/O buffer for the CPU 10. The I/O controller 16 may also share part of the function of the CPU to check new and old data for a switch address sent from the keyboard. Thus, for example, the I/O controller 16 may have a function to judge that continuous inputs from the same key is construed as one input.

For better understanding of the present invention, a prior art input system will be described briefly with reference to FIG. 4.

Figure 4:
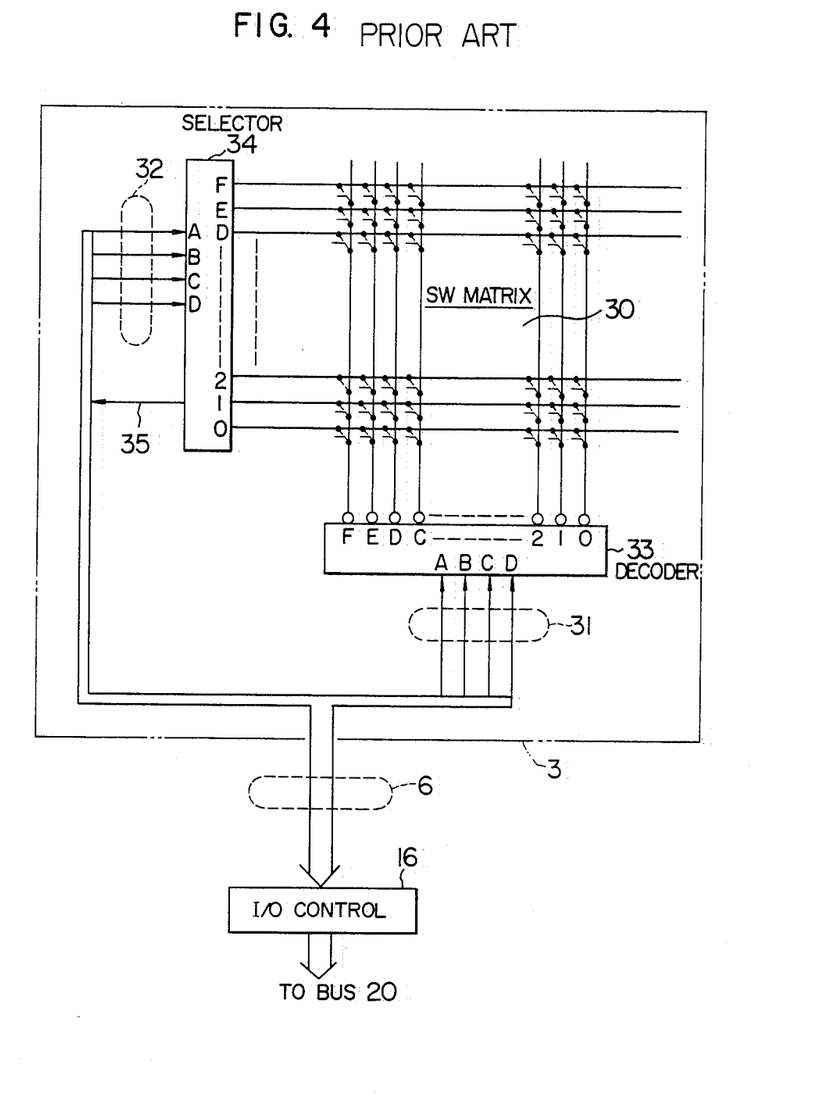
FIGS. 4 and 5 are block diagrams of a prior art input system.

In FIG. 4, an input device 3 comprises a decoder 33, a selector 34, a switch matrix 30 corresponding to input keys, input signal lines 31 to the decoder 33, select signal lines 32 to the selector 34, and an output signal line 35 from the selector 34. The input device 3 is connected to an I/O controller 16 via a bus 6.

When signals on the input signal lines 31 and select signal lines 32 are decoded and a row line and a column line of the switch matrix 30 are designated, a switch disposed at a cross point of these row and column lines is specified and on-off information represented by the switch is delivered out of the output line 35. For example, the output signal line 35 assumes a high level when the switch is on and a low level when the switch is off.

Signals on the input signal lines 31 and select signal lines 32 are varied sequentially to scan switches in the matrix 30 and on-off states thereof are checked.

Disposed at cross points of row lines and column lines of the switch matrix 30 are typical bidirectional switches. Respective switches permit bidirectional current flow and as a result, when three or more switches disposed at the cross points are turned on, there may occur a state in which a switch being now off is recognized as being on, resulting in a so-called roundabout of switch signal.

Figure 5:
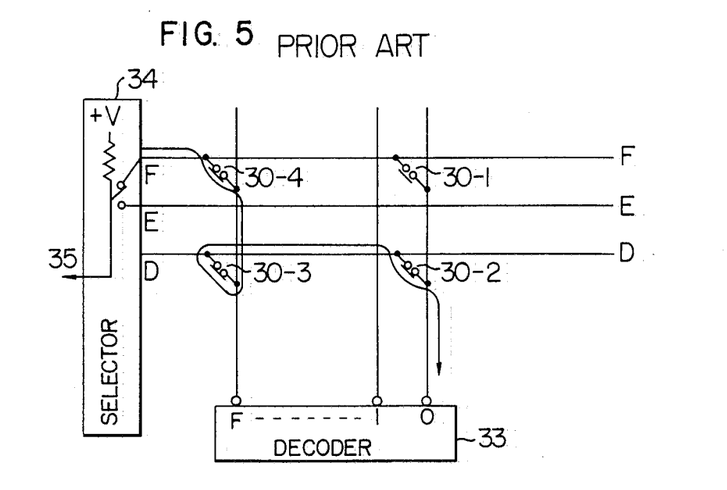

An example of a roundabout will be explained with reference to FIG. 5. It is now assumed that an output line (column 0) of the decoder 33 and an input line (row F) of the selector 34 are selected. Then, on-off state of a contact 30-1 is to be checked. However, current is passed along an arrow even with the contact 30-1 being off if contacts 30-2, 30-3 and 30-4 disposed at three cross points are on, with the result that an output indicative of on-state of the contact 30-1 is delivered out of the output signal line 35. In other words, erroneous on-state of a contact to be recognized as being off is inputted. The present invention intends to reduce possibility for such a situation to occur and stop input operation when such a situation occurs.

Figure 6:
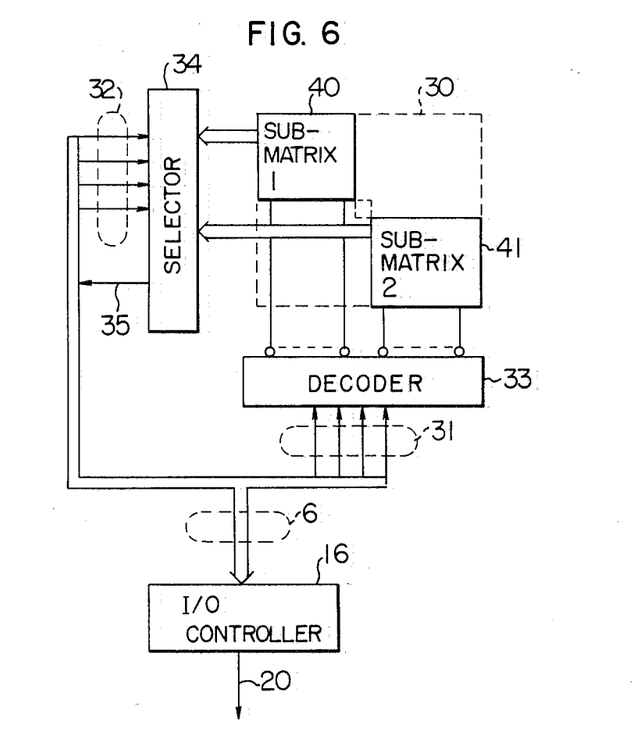
FIGS. 6 and 7 are block diagrams of an input system embodying the invention.

As schematically shown in FIG. 6, in a preferred embodiment of the present invention, a switch matrix 30 is divided into at least two submatrices 40 and 41 which are mutually independent. The member of submatrices may be selected arbitrarily. In the case of two submatrices, correct detection of input can be assured when up to four contacts, two in the submatrix 40 and two in the submatrix 41, are turned on simultaneously. The division of the switch matrix 30 may be accomplished in various manners. For example, main function keys may be grouped into one submatrix and auxiliary function keys into the other submatrix. Alternatively, right-hand-finger-operated keys may be grouped into one submatrix and left-hand-finger-operated keys into the other.

Figure 7:
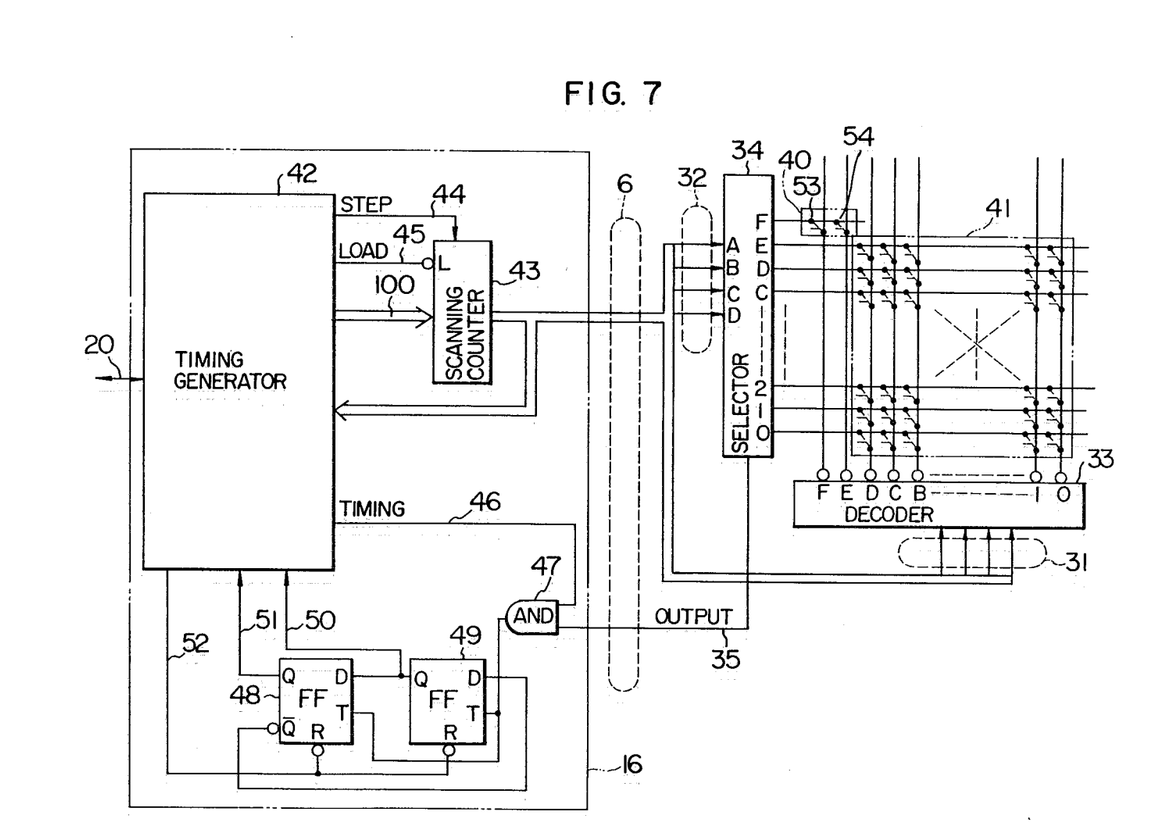

The arrangement of FIG. 6 is illustrated in greater detail in FIG. 7. As shown, an I/O controller 16 comprises a timing generator 42 including a temporary memory, a scanning counter 43, a pulse signal line 44 for advancing the scanning counter 43, a load pulse signal line 45 for setting a data into the scanning counter 43, a two-input AND gate 47, and flip-flop circuits 48 and 49. The switch matrix is divided into submatrices 40 and 41. The submatrix 40 includes keys to be used in combination with the other keys, such as shift keys for capital character designation and continuous keys for continuous input designation of the same key. Thus, the keys in the submatrix 40 are effective only when used in combination with keys in the submatrix 41. Exemplarily, two keys 53 and 54 of either one-step (automatic release) or two-step (lock and release) type are disposed at addresses (F, F) and (E, F), where the preceding and succeeding symbols parenthesized represent an address associated with the decoder 33 and an address associated with the selector 34, respectively.

Now, a circuitry comprised of the two-input AND gate 47 and flip-flop circuits 48 and 49 will be described. This circuitry functions to check the number of switches which are turned on, and it operates as follows. A signal on an output signal line 35 is applied to one input of the two-input AND gate 47 and a pulse signal on a pulse signal line 46 is applied to the other input. When a contact corresponding to a value of the scanning counter 43 is on, the timing pulse on the pulse signal line 46 and the output signal line 35 are applied to the AND gate 47 which in turn produces an output of high level. The high level output of the AND gate 47 triggers the flip-flop circuits 48 and 49. A Q output of the flip-flop circuit 49 is coupled to a D input of the flip-flop circuit 48 and a Q output of the flip-flop circuit 48 is coupled to a D input of the flip-flop circuit 49. With this construction, each time the flip-flop circuits 48 and 49 are triggered, signal levels on monitor signal lines 50 and 51 of these flip-flop circuits vary as follows.

| Number of triggers | Monitor signal 50 | Monitor signal 51 |
|---|---|---|
| 0 | 0 | 0 |
| 1 | 1 | 0 |
| 2 | 1 | 1 |
| 3 | 0 | 1 |

The fourth trigger causes the signals 50 and 51 to return to their original states corresponding to the trigger number 0 and thus the level variation is repeated cyclically.

When simultaneous on-state of three contacts is detected, the signal level on the monitor signal line 50 becomes "0" (low level) and the signal level on the monitor signal line 51 becomes "1" (high level). If the normal processing proceeds when three or more switches are turned on simultaneously, the erroneous detection as described with reference to FIG. 5 will occur. Accordingly, when the third on-state is detected in one scanning, a processing is executed which recognizes that any on-state contact would not be present in the one scanning, for the sake of preventing the erroneous detection.

Figure 8:
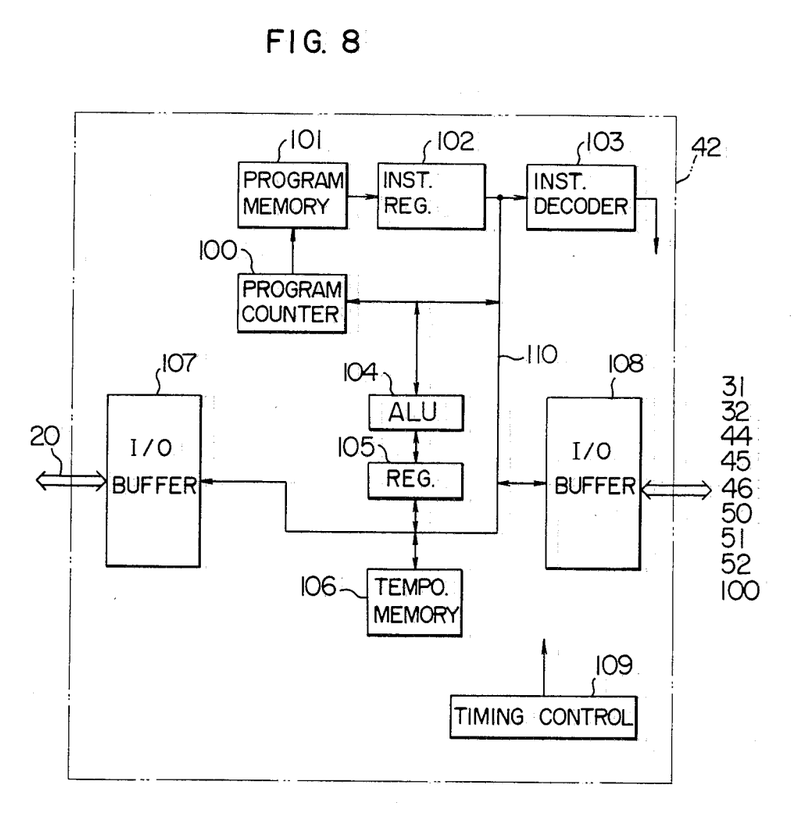
FIG. 8 is a block diagram of a timing generator in FIG. 7.

An example of the timing generator 42 adapted for materializing the processing set forth above will now be described with reference to FIG. 8.

The timing generator 42 exemplified herein comprises a program memory 101 for storing a program indicative of sequence of processing in the input system (a read only memory ROM is generally used as memory 101), an instruction register 102 for temporarily storing an instruction code read out of the program memory, and an instruction decoder 103 for decoding contents of an instruction code stored in the instruction register. The timing generator 42 thus constructed operates under the control of the instruction code and timing pulses from a timing controller 109 which control operation timing of the entire circuit.

A program counter 100 is provided for designating addresses of the instruction code in the program memory 101 and updating the addresses.

In addition to the above components, the timing generator 42 further comprises a logical operation unit 104 for judging status (for example, on-off state of flags), a register 105 connected to the logical operation unit for temporary storage of contents thereof, a temporary memory 106 for storing status flags ($F_0$, $F_1$, $F_2$ etc. to be explained later) and on-state addresses of the switches (a random access memory RAM is generally used as memory 106), an I/O buffer 107 through which the circuit 42 is coupled to a bus line 20 for connection to the CPU 10, and an I/O buffer 108 for input/output connection to peripheral units. The above components are interconnected through an internal bus 110.

Figure 9:
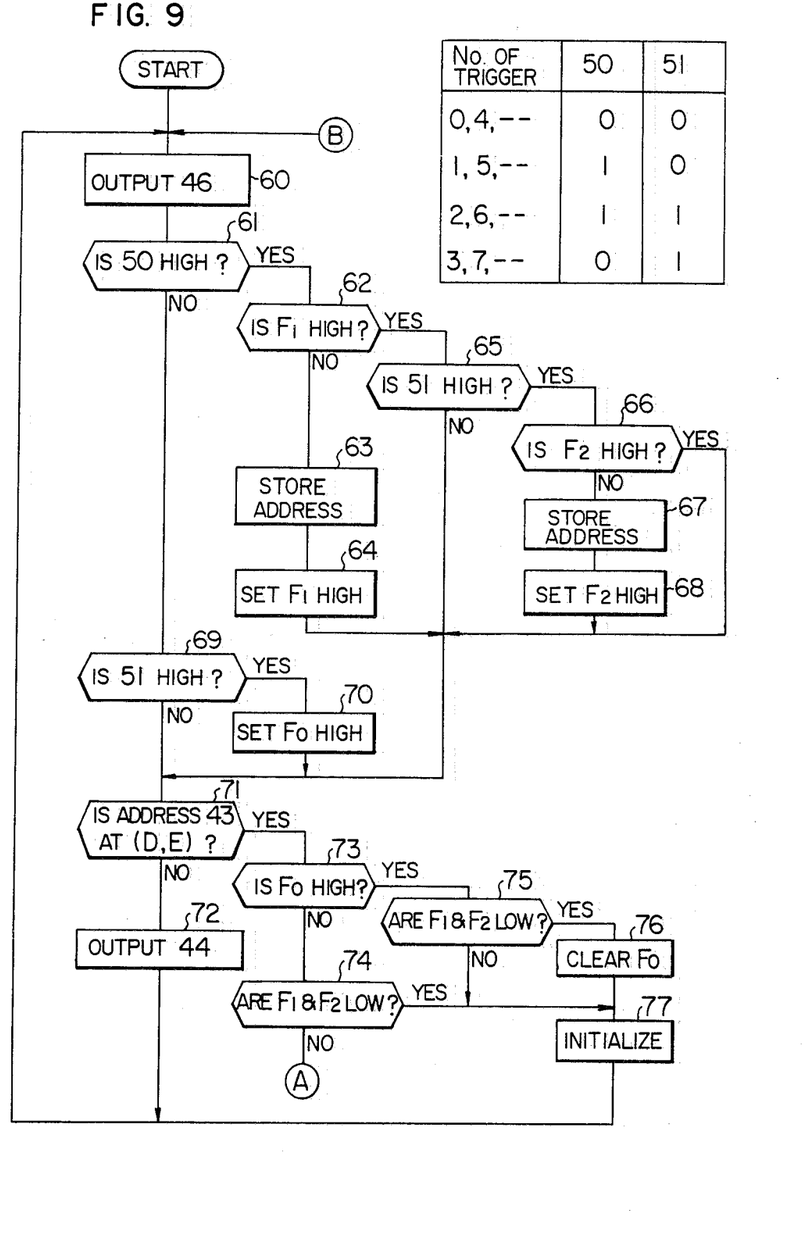
FIGS. 9, 10 and 11 are flow charts useful in explaining the operation of the input system shown in FIGS. 6 and 7.
Figure 10:
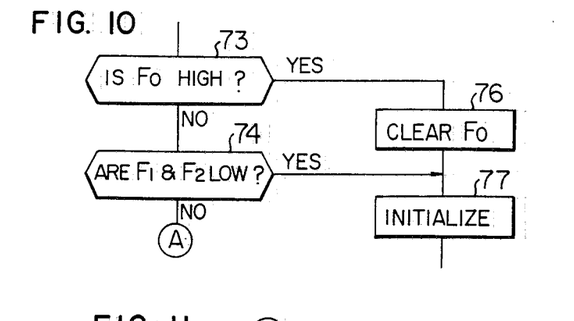
Figure 11:
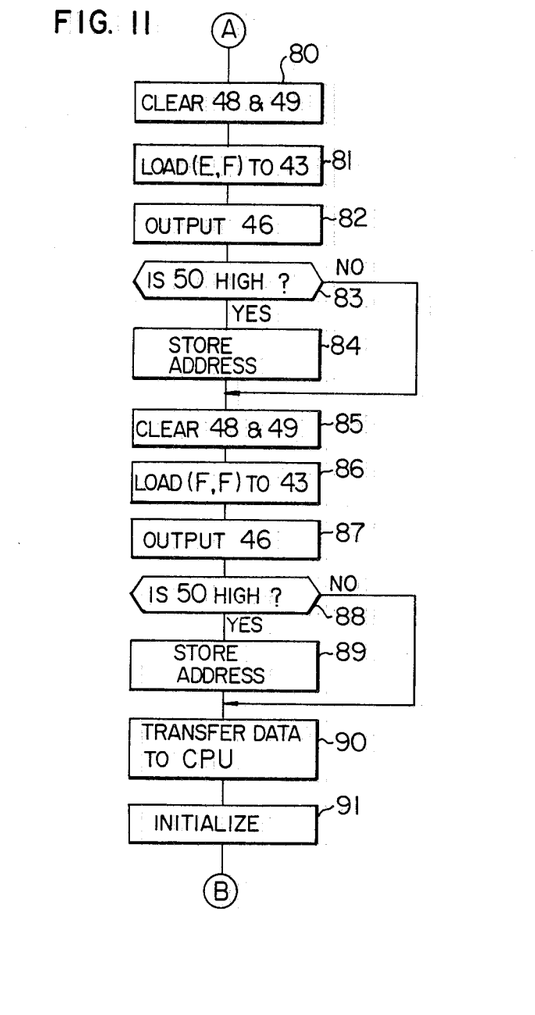

The operation of the input system will be described with reference to flow charts as shown in FIGS. 9 to 11.

In synchronism with scanning for the switch matrix, the timing generator 42 generates timing pulses on the line 46 (step 60). When a switch being scanned is on and the output signal on the line 35 is high, the output of the two-input AND gate 47 becomes high, thus applying a trigger signal to trigger terminals T of the flip-flop circuits 48 and 49. With a first trigger signal applied, the signal on line 50 becomes high, and a second trigger signal applied renders the signals on both the lines 50 and 51 high. Thereafter, the signals on lines 50 and 51 vary as shown at a table in FIG. 9 in accordance with the application of the trigger signals.

Each time the timing signal is produced on the line 46, it is checked as to whether the signal on the monitor signal line 50 is high (step 61). If high, a flag $F_1$ is checked (step 62) which indicates whether or not on-state of at least one switch in the submatrix 41 has been detected and processed. Thus, a high level of the flag $F_1$ indicates that at least one on-state has been processed. When an output signal representative of an initial (the first) on-state in a particular scanning of interest is inputted, the signal on the line 50 is rendered high "1" by the output of the AND gate 47 but the flag $F_1$ still remains low, indicating that the onstate in the particular scanning has not yet been processed, that is, the inputted signal representative of on-state is the first one. The output of the scanning counter 43 now occurring is stored in the timing generator 42 so that an address is stored therein (step 63). Subsequently, the flag $F_1$ is rendered high to record the thus processed initial trigger signal (step 64) and the program jumps to step 71.

When the high level of the flag $F_1$ is judged in the step 62, the signal state on the monitor signal line 51 is checked (step 65). If the signal on monitor signal line 51 is low, indicating that a fifth trigger signal, a ninth trigger signal or the like trigger signal is occurring, the program jumps to the step 71.

If the signal on monitor signal line 51 is high, a flag $F_2$ is checked (step 66) which indicates whether or not a second on-state has been detected and processed. Here, a high level of the flag $F_2$ indicates that on-state of at least two switches has been processed.

When the flag $F_2$ is low, indicating that the second on-state has not yet been processed, the output of the scanning counter 43 now occurring is stored in the timing generator 42 so that an address is stored therein (step 67). Subsequently, the flag $F_2$ is rendered high to record the thus processed second on-state and the program jumps to the step 71.

When the high level of the flag $F_2$ is judged in the step 66, indicating that a sixth on-state, a tenth on-state or the like on-state is occurring, the program jumps to the step 71.

If the low level of the signal on the monitor signal line 50 is judged in the step 61, indicating that the number of detected on-states is 0, 3, 4, 7 and so on, the address recording will become unnecessary and the program proceeds to step 69.

In the step 69, the signal level on the monitor signal line 51 is checked. When this signal level is high, indicating that simultaneous on-state of three contacts is detected, a flag $F_0$ representative of simultaneous on-state of three or more contacts is rendered high in step 70. The program may proceed to the step 70 when a seventh on-state and an eleventh onstate are detected but no problem will arise.

Thereafter, the value of the scanning counter 43 is checked in the step 71. Thus, it is judged as to whether this value is a final address (D, E), of the submatrix 41 for judging whether the detection of the submatrix 41 has been completed.

When the address (D, E) has not yet been reached, an advance signal is produced on the pulse signal line 44 to advance the scanning counter 43 and thereafter, the program jumps to step 60.

When the address (D, E) is reached, indicating that the detection of the submatrix 41 has been completed, the program proceeds to step 73. In the step 73, the level of the flag $F_0$ is examined to check whether three or more contacts in the submatrix 41 have been on.

If the flag $F_0$ is low, indicating that a normal state standing for two or less on-states is occurring, the flags $F_1$ and $F_2$ are examined to check whether on-state is detected (step 73).

If either the flag $F_1$ or the flags $F_1$ and $F_2$ are high, the submatrix 40 is examined ( (A) ). If both the flags $F_1$ and $F_2$ are low, indicating that no on-state has been detected, the program proceeds to step 77 where the entire circuit is initialized to initiate a new scanning.

In this phase of the program, the other submatrix 40 is not checked because contacts in the submatrix 40 cannot fulfil themselves unless the contacts for character designation in the submatrix 41 are effective.

When the flag $F_0$ is high, at least three contacts are in on-state in the current scanning or in a previous scanning (as described in more detail hereinbelow). Then, it is checked whether both the flags $F_1$ and $F_2$ are of low level or not in step 75.

When at least three contacts are in on-state, the flags $F_1$ and $F_2$ are naturally both of high level. Thus, the process goes to step 77 where all the circuit conditions except the flag $F_0$ are initialized and then jumps to step 60. Here, the flags $F_1$ and $F_2$ are reset to low level in step 77 to find out any on-state contacts in the following new scanning. If at least one switch is in on-state, the on-state contact is detected in step 75 and another new scanning is initiated through step 77 without clearing the flag $F_0$.

Only when no contact in the submatrix 41 is in on-state, both the flags $F_1$ and $F_2$ are left low and the flag $F_0$ is cleared (step 76). As described above, once three or more keys are depressed, the detection of the depressed keys are stopped until all the keys are released, thereby preventing erroneous detection and consequent erroneous input. This also eliminates labor for correction.

While, in the foregoing description, with the simultaneous operation of three or more switches in the submatrix 41, normal operation is prevented to restart until all the switches are released, the normal operation may be restarted when the number of inputs reduces from three to two. For example, when, in the case of sequential depression of three keys for characters x, y and z, simultaneous depression of three keys is recognized for the first time in response to depression of the key for character z after sequential depression of the keys for characters x and y, these inputs may be detected as being normal. Such a processing will be described with reference to a flow chart shown in FIG. 10.

In FIG. 10, the flow chart of FIG. 9 is partly modified with steps 60 to 73 unchanged. In this modified flow chart, when the flag $F_0$ is high in step 73, the flag $F_0$ is cleared (step 76), the entire circuit is initialized in step 77, and the program jumps to the step 60 for restarting. When the flag $F_0$ is low and both the flags $F_1$ and $F_2$ are low, indicating that no on-state is detected, new one scanning is also initiated through step 77. Namely, normal detection of on-state contact is carried out in each scanning.

Where three inputs for characters x, y and z were applied, normal operation starts when at most two inputs, for example characters y and z, in new one scanning are detected. In this case, the detection of character y which has already been completed in a previous scanning is put aside through another judgement (not shown) and the input of character z is detected. Technique of detecting a continued depression of the same key is known and will also be applied to other cases.

When a normal input is applied to the submatrix 41, the program will proceed as will be described with reference to FIG. 11, on the assumption that the submatrix 40 includes two switches 54 (E, F) and 53 (F, F).

When either the flag $F_1$ or both the flags $F_1$ and $F_2$ are high, the other submatrix 40 is checked.

The signal is produced on the signal line 52 to clear the flip-flop circuits 48 and 49 (step 80).

Subsequently, an address (E, F) is set onto an output line 100 and the signal on the load pulse signal line 45 loads the address (E, F) to the scanning counter 43 (step 81).

Thereafter, a pulse is produced on the pulse signal line 46 (step 82).

In step 83, it is checked as to whether the signal on the monitor signal line 50 is high. If high, the address (E, F) is stored in the timing generator 42 (step 84).

If it is judged in step 83 that the signal on monitor signal line 50 is low, indicating that the switch associated with the address (E, F) is off, the program jumps to step 85.

In step 85, a signal is produced on a signal line 52 to clear the flip-flop circuits 48 and 49.

Thereafter, an address (F, F) is set onto the output line 100, and the signal on the load pulse signal line 45 loads the address (F, F) to the scanning counter 43 (step 86).

Subsequently, in step 87, a pulse is produced on the pulse signal line 46.

It is checked in step 88 as to whether the signal on the monitor signal line 50 is high. If high, the address (F, F) is stored in the timing generator 42 (step 89).

If it is judged in step 88 that the signal on the monitor signal line 50 is low, indicating that the switch associated with the address (F, F) is off, the program proceeds to step 90.

In the step 90, data transfer processing is carried out so that the addresses derived as a result of scanning are transferred to the CPU 10.

Subsequently, in step 91, the entire circuit is initialized, and the program jumps to the step 60 to restart scanning. To this end, the internal flags are cleared, an address (O, O) is set into the scanning counter 43 and the signal is produced on the signal line 52 to clear the flip-flop circuits 48 and 49. In order to assure a high speed input of about 200 stroke/minute in average, it is preferred that the operation speed be about 15 msec/scanning or higher.

As described above, according to the foregoing embodiment, the input system can be materialized which can detect correct addresses without causing erroneous input even when a plurality of contacts are turned on simultaneously.

The number of contacts in the submatrix 40, which is two in the foregoing embodiment, may be increased as necessary. Further, the submatrix 40, subsidiary to the submatrix 41 in the foregoing embodiment, may not be associated with the submatrix 41. In such a case, the submatrix 40 may also be processed in a similar manner as shown in the flow chart of FIG. 9.

As has been described, according to the present invention, a plurality of contacts are divided into a plurality of groups and the contacts in one group are processed independently of the contacts in another group, thereby materializing the input system which can eliminate erroneous input even when a plurality of contacts are turned on simultaneously. Further, because of the elimination of the diodes for blocking roundabout, the number of parts can be reduced.

I claim:

1. A keyboard circuit including a multiplicity of switches disposed in a matrix connected to associated row lines and column lines, first means for scanning one of the row lines or column lines and establishing a predetermined voltage on the one scanned line, second means for detecting said predetermined voltage from the other one of the scanned row lines or column lines, and recognition means for recognizing the address of an on-state switch from the line addresses of the scanned line in said first means and of the detected line in said second means when the predetermined voltage is detected by said second means comprising:

said multiplicity of switches being disposed in at least two independent submatrices defined in said matrix, the row lines and the column lines of one of the submatrices being different from those of the other of the submatrices; and means for stopping recognition of a new on-state switch when at least three on-state switches are detected in one submatrix in one scanning.

2. A keyboard circuit as defined in claim 1, wherein said means for stopping recognition includes means for coding the number of on-state switches.

3. A keyboard circuit as defined in claim 2, wherein said means for stopping recognition further includes a temporary memory for storing flags respectively indicating that a first, a second and a third on-state switch is detected in a scanning.

4. A keyboard circuit as defined in claim 3, wherein said temporary memory further stores an address of the first and the second on-state switches.

5. A keyboard circuit as defined in claim 4, wherein said recognition stopping means allows an output of said address at the end of each scanning when said third flag is absent and at least said first flag is present.

6. A keyboard circuit as defined in claim 1, wherein one of said submatrices is associates with keys on a keyboard which perform their function only in combination with keys on the keyboard which are associated with the other of said submatrices.

7. A keyboard circuit as defined in claim 1, wherein one of said submatrices is associated with keys on a keyboard to be operated by left hand fingers of an operator.

8. A keyboard circuit as defined in claim 7, wherein the other of said submatrices is associated with keys to be operated by right hand fingers of an operator.

9. A keyboard circuit as defined in claim 1, wherein said recognition stopping means is set for stopping recognition by detection of at least three on-state switches in one submatrix in one scanning and is reset by detection of no on-state switch in the submatrix in a succeeding scanning.

10. A keyboard circuit as defined in claim 1, wherein said recognition stopping means is set for stopping recognition by detection of at least three on-state switches in one submatrix in one scanning and is reset by detection of at most two on-state switches in the submatrix in a succeeding scanning.

11. A keyboard circuit according to claim 1, wherein said means for stopping recognition includes means for causing a next scanning without performing voltage establishment and voltage detection of lines in the other submatrix when at least three on-state switches are detected in one scanning in the one submatrix.

12. A keyboard circuit according to claim 1, wherein said one submatrix includes character keyswitches and said the other submatrix includes a shift key switch.

13. A keyboard circuit according to claim 12, wherein said means for stopping recognition does not perform recognition of said the other submatrix when at least three on-state switches are detected in said one submatrix in one scanning.

14. An input system having a multiplicity of input switches arranged in a matrix of rows and columns, comprising:

means for addressing said matrix by scanning to detect an on/off state of the respective switches;

said matrix including at least two independent submatrices $X_{ij}$, $X_{kl}$ and, where $i \neq k$ and $j \neq l$;

said switches being disposed at cross points of rows and columns in said sub-matrices;

means for registering the number of on-state switches in at least one of the submatrices detected in each scanning; and means for supplying the address of an on-state switch only when said registered number is one or two.

* * * * *